United States Patent
Eom et al.

(10) Patent No.: US 12,501,715 B2
(45) Date of Patent: *Dec. 16, 2025

(54) ELECTRO-STATIC DISCHARGE PROTECTION DEVICES HAVING A LOW TRIGGER VOLTAGE

(71) Applicant: SK hynix system ic (Wuxi) Co., Ltd., Jiangsu Province (CN)

(72) Inventors: Young Bum Eom, Chungcheongbuk-do (KR); Myoung Chul Lim, Chungcheongbuk-do (KR)

(73) Assignee: SK hynix system ic (Wuxi) Co., Ltd., Jiangsu Province (CN)

( * ) Notice: Subject to any disclaimer, the term of this patent is extended or adjusted under 35 U.S.C. 154(b) by 0 days.

This patent is subject to a terminal disclaimer.

(21) Appl. No.: 18/320,201

(22) Filed: May 19, 2023

(65) Prior Publication Data
US 2023/0290771 A1   Sep. 14, 2023

Related U.S. Application Data

(63) Continuation of application No. 17/142,518, filed on Jan. 6, 2021, now abandoned.

(30) Foreign Application Priority Data

Jul. 3, 2020   (KR) .................. 10-2020-0082393

(51) Int. Cl.
H10D 89/60    (2025.01)
H02H 9/04     (2006.01)

(52) U.S. Cl.
CPC .......... H10D 89/713 (2025.01); H02H 9/046 (2013.01)

(58) Field of Classification Search
None
See application file for complete search history.

(56) References Cited

U.S. PATENT DOCUMENTS

| | | | |
|---|---|---|---|
| 2003/0151498 A1* | 8/2003 | Wuidart | G06K 19/0723 340/10.52 |
| 2004/0164356 A1* | 8/2004 | Josef Mergens | H01L 27/0292 257/361 |
| 2021/0193643 A1* | 6/2021 | Hsu | H10D 62/151 |

FOREIGN PATENT DOCUMENTS

KR      101304051 B1 *  9/2013  ......... H01L 27/0262

OTHER PUBLICATIONS

KR 101304051 B1; Electrostatic Discharge Protection Circuit; Koo Yong Seo. (Year: 2013).*
Electrostatic Discharge Protection Device for Low-voltage; 2017 (Year: 2017).*

* cited by examiner

*Primary Examiner* — Nilufa Rahim
(74) *Attorney, Agent, or Firm* — IP & T GROUP LLP

(57) ABSTRACT

An electro-static discharge (ESD) protection device includes a first well region, a second well region, a first diffusion region disposed in the first well region, a plurality of second diffusion regions disposed in the first well region separated from each other by the first diffusion region in a first direction, a third diffusion region disposed in the second well region, a plurality of fourth diffusion regions disposed in the second well region separated from each other by the third diffusion region in the first direction, a resistive pattern coupled to the first diffusion region through a first contact plug, a first electrode coupled to the plurality of second diffusion regions and electrically coupled to the resistive pattern, and a second electrode coupled to the third diffusion region and coupled to the plurality of fourth diffusion regions.

6 Claims, 16 Drawing Sheets

ELECTRO-STATIC DISCHARGE PROTECTION DEVICES HAVING A LOW TRIGGER VOLTAGE

CROSS-REFERENCE TO RELATED APPLICATIONS

This is a continuation application of U.S. patent application Ser. No. 17/142,518, filed on Jan. 6, 2021, which claims priority to Korean Patent Application No. 10-2020-0082393, filed on Jul. 3, 2020, which is herein incorporated by references in its entirety.

BACKGROUND

1. Technical Field

Various embodiments of the present disclosure relate to electro-static discharge (ESD) protection devices and, more particularly, to ESD protection devices having a low trigger voltage.

2. Related Art

Generally, semiconductor devices include ESD protection circuits for protecting various inner circuits. An ESD protection circuit is typically coupled between a signal pad (or a data pad) and a ground pad. If the signal pad (or the data pad) of the semiconductor device is in contact with a charged human body or machine, static electricity may be generated momentarily and produce high voltage which may be applied to the signal pad. In such a case, the ESD protection circuit connected to the signal pad may provide a bypass current path to prevent an inner circuit of the semiconductor device from being damaged. In the development of micro-chips, design of the ESD protection circuits is becoming increasingly more important for protecting the micro-chips from ESD stress and for providing highly reliable micro-chips. The ESD protection circuit may also be referred to as an ESD protection device.

Various kinds of ESD protection devices have been used to protect the micro-chips. For example, a gate grounded N-type MOS field effect transistor (hereinafter, referred to as a 'GGNMOS') device has been widely used as the ESD protection device. However, if the GGNMOS device is employed as the ESD protection device for a chip, it may be difficult to reduce a size of the chip because the GGNMOS device occupies a relatively large area. In general, a current tolerance value of the GGNMOS device is merely within the range of about 5 mA/μm to about 10 mA/μm. Thus, to meet an industrial standard value (i.e., 2 amperes) of an ESD current, the GGNMOS device has to be designed to have a channel width of about 200 μm to about 400 μm. In addition, a drain region of the GGNMOS device has to be designed to have a relatively large area to obtain an excellent ESD characteristic of a chip. Accordingly, using a GGNMOS device as the ESD protection device limits the design of highly integrated micro-chips. Moreover, because the GGNMOS device used as the ESD protection device is coupled to a ground pad, the ESD protection device may exhibit a relatively high trigger voltage. If the trigger voltage of the ESD protection device is relatively high, a high voltage signal generated by static electricity may be transmitted to an inner circuit of the chip. As a result, the inner circuit of the chip may be damaged and cause malfunction of the chip.

SUMMARY

According to another embodiment, an electro-static discharge (ESD) protection device includes a first well region of a first conductivity type, a second well region of a second conductivity type disposed to contact the first well region, a first diffusion region of the first conductivity type disposed in the first well region, a plurality of second diffusion regions of the second conductivity type disposed in the first well region separated from each other by the first diffusion region in a first direction, a third diffusion region of the second conductivity type disposed in the second well region, a plurality of fourth diffusion regions of the first conductivity type disposed in the second well region separated from each other by the third diffusion region in the first direction, a resistive pattern coupled to the first diffusion region through a first contact plug, a first electrode coupled to the plurality of second diffusion regions through respective second contact plugs and electrically coupled to the resistive pattern, and a second electrode coupled to the third diffusion region through a third contact plug and coupled to the plurality of fourth diffusion regions through respective fourth contact plugs.

According to yet another embodiment, an electro-static discharge (ESD) protection device includes a silicon controlled rectifier (SCR) component coupled between an anode and a cathode to provide a discharge current path. The SCR component includes a first bipolar junction transistor (BJT) of a PNP structure having an emitter coupled to the anode, a base coupled to a first node, and a collector coupled to a second node, a second BJT of an NPN structure having an emitter coupled to the cathode, a base coupled to the second node, and a collector coupled to the first node, a third BJT of an NPN structure having an emitter coupled to the cathode, a base coupled to the second node, and a collector coupled to the first node, and an external resistive component coupled between the second node and the emitter of the second BJT.

These and other features and advantages of the present invention will become better understood by those with ordinary skill in the art of the invention from the following figures and detailed description.

BRIEF DESCRIPTION OF THE DRAWINGS

The accompanying figures, where like reference numerals refer to identical or functionally similar elements throughout the separate views, together with the detailed description below serve to further illustrate embodiments that include the claimed novelty, and describe various principles and advantages of those embodiments.

DETAILED DESCRIPTION OF THE EMBODIMENTS

In the following description of embodiments, it will be understood that the terms "first" and "second" are intended to identify elements, but are not used to define a particular number or sequence of elements. In addition, when an element is referred to as being located "on," "over," "above," "under," or "beneath" another element, it is intended to mean a relative position relationship, and is not used to limit certain cases where the element directly contacts the other element, or at least one intervening element is present therebetween. Accordingly, the terms such as "on," "over," "above," "under," "beneath," "below," and the like that are used herein are for the purpose of describing particular embodiments only and are not intended to limit the scope of the present disclosure. Further, when an element is referred to as being "connected" or "coupled" to another element, the element may be electrically or mechanically connected or coupled to the other element directly, or may be electrically or mechanically connected or coupled to the other element indirectly with one or more additional elements therebetween.

Various embodiments are directed to ESD protection devices.

Figure 1:
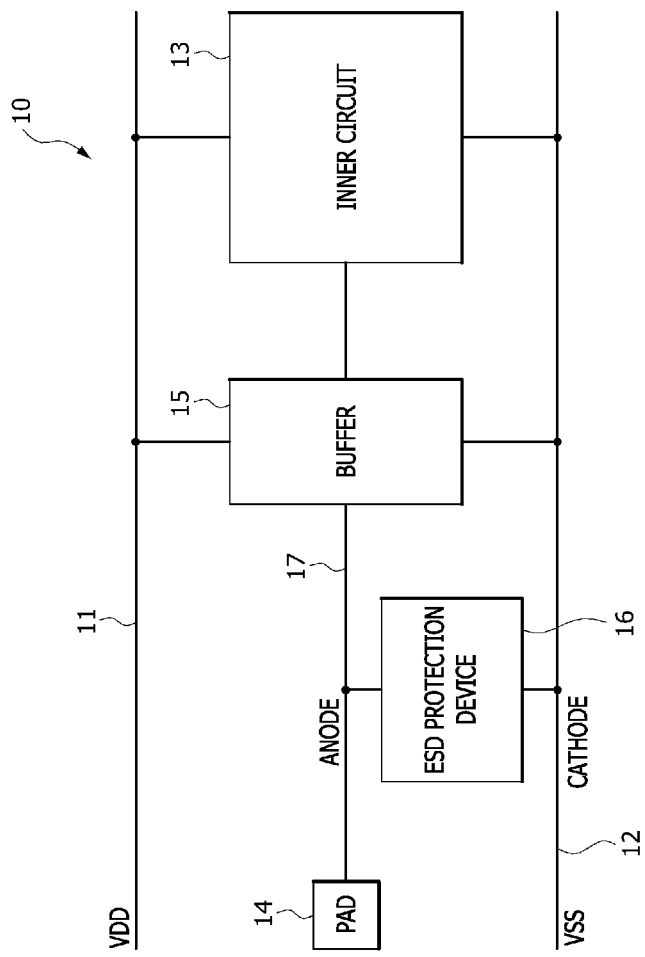
FIG. 1 is a block diagram illustrating an input/output (I/O) part including an ESD protection device.

FIG. 1 is a block diagram illustrating an input/output (I/O) part 10 of a chip including an ESD protection device 16. Referring to FIG. 1, the I/O part 10 may include an inner circuit 13 coupled between a first line 11 connected to a supply terminal of a power source voltage VDD and a second line 12 connected to a supply terminal of a ground voltage VSS. The I/O part 10 may further include a buffer 15 and the ESD protection device 16. The buffer 15 may be coupled between the inner circuit 13 and a pad 14, and the ESD protection device 16 may be coupled between a third line 17 connected to the pad 14 and the second line 12 connected to the supply terminal of the ground voltage VSS. The pad 14 may correspond to an I/O pad. The ESD protection device 16 may include an anode connected to the pad 14 through the third line 17. In addition, the ESD protection device 16 may include a cathode connected to the supply terminal of the ground voltage VSS through the second line 12.

In general, each of the inner circuit 13 and the buffer 15 may be designed to include a plurality of MOS transistors. As semiconductor chips become more highly integrated and operate at a higher speed, a thickness of gate insulation layers of the MOS transistors has been reduced. Thus, a breakdown voltage of the gate insulation layers of the MOS transistors may be lowered. That is, the gate insulation layers of the MOS transistors may be easily damaged if a high voltage signal is applied to gate electrodes of the MOS transistors constituting the buffer 15 or the inner circuit 13. Accordingly, it may be necessary to design the ESD protection device 16 to have a low trigger voltage. The following embodiments provide various ESD protection devices having a low trigger voltage to protect the inner circuit 13 from ESD stress.

Figure 2:
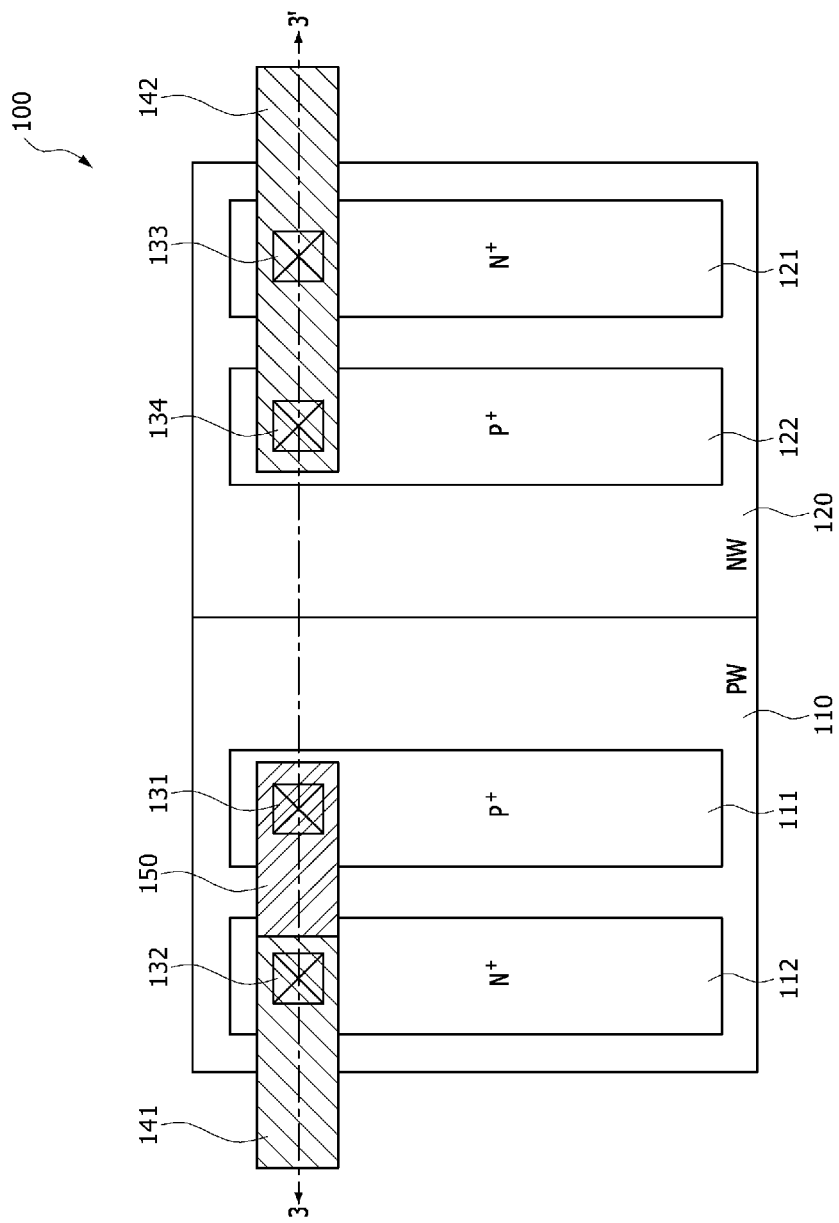
FIG. 2 is a layout diagram of an ESD protection device according to an embodiment of the present disclosure.
Figure 3:
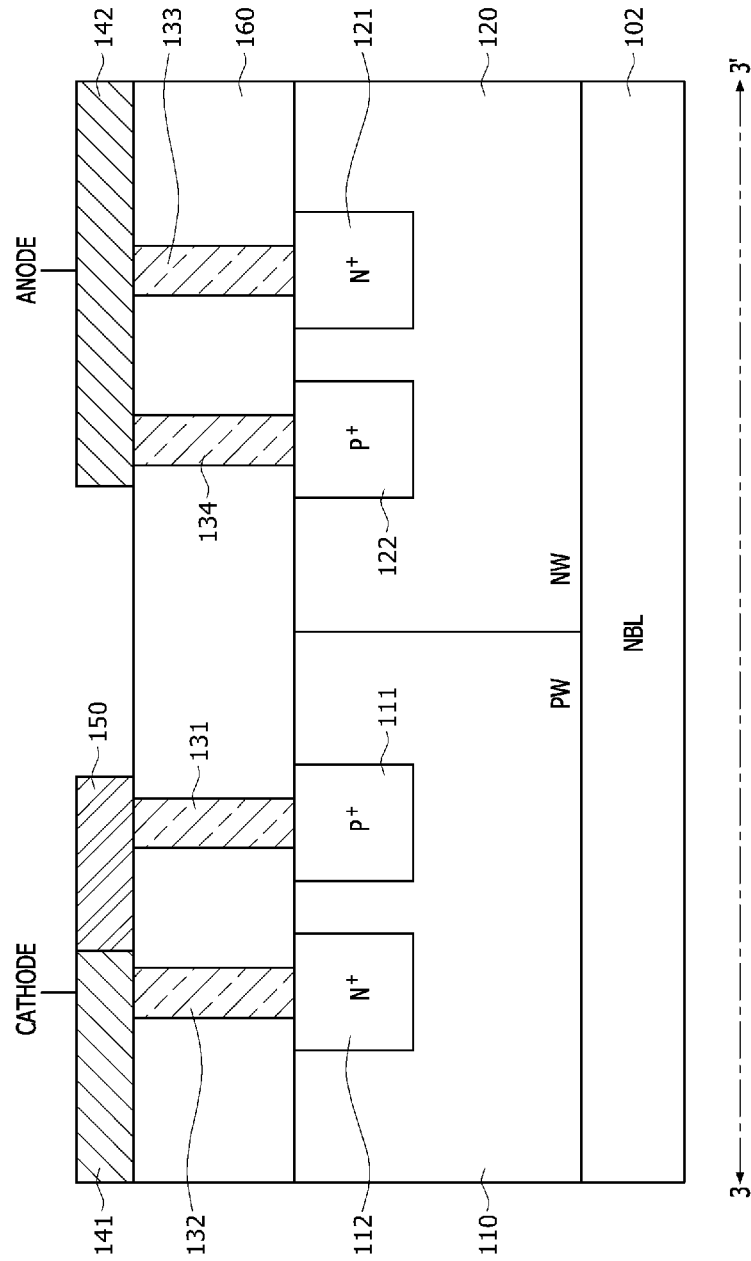
FIG. 3 is a cross-sectional view taken along a line 3-3' of FIG. 2.

FIG. 2 is a layout diagram illustrating an ESD protection device 100 according to an embodiment of the present disclosure. FIG. 3 is a cross-sectional view taken along a line 3-3' of FIG. 2. Referring to FIGS. 2 and 3, the ESD protection device 100 may include a first well region 110 having a first conductivity type and a second well region 120 having a second conductivity type. In an embodiment, the first conductivity type may be a P-type, and the second conductivity type may be an N-type. In an embodiment, the first well region 110 (e.g., a P-type well region) and the second well region 120 (e.g., an N-type well region) may be disposed on an N-type buried layer (NBL) 102. Although the present embodiment of FIG. 3 is described in conjunction with a case that the P-type well region 110 and the N-type well region 120 are disposed on the N-type buried layer (NBL) 102, the present embodiment is merely an example of the present disclosure. For example, in some other embodiments, the P-type well region 110 and the N-type well region 120 may be disposed on a semiconductor layer other than the N-type buried layer 102. A side surface of the P-type well region 110 may physically contact a side surface of the N-type well region 120. Thus, the P-type well region 110 and the N-type well region 120 may provide a lateral diode having a P-N junction.

A first diffusion region 111 (i.e., a P-type diffusion region) may be disposed in a first upper region of the P-type well region 110. A second diffusion region 112 (i.e., an N-type diffusion region) may be disposed in a second upper region of the P-type well region 110. In an embodiment, each of the P-type diffusion region 111 and the N-type diffusion region 112 may have a stripe shape (i.e., long narrow band having the same width along its length) elongating (extending on its length direction) in a first direction (i.e., a vertical direction in FIG. 2). In an embodiment, the P-type diffusion region 111 and the N-type diffusion region 112 may be spaced apart from each other in a second direction (i.e., a horizontal direction in FIG. 2) intersecting the first direction. Thus, the P-type diffusion region 111 and the N-type diffusion region 112 may be separated from each other by the P-type well region 110 in the second direction. The concentration of impurity in each of the P-type diffusion region 111 and N-type diffusion region 112 may differ. The P-type diffusion region 111 may have an impurity concentration which is higher than an impurity concentration of the P-type well region 110, and the N-type diffusion region 112 may have an impurity concentration which is higher than an impurity concentration of the N-type well region 120.

A third diffusion region 121 (i.e., an N-type diffusion region) may be disposed in a first upper region of the N-type well region 120. A fourth diffusion region 122 (i.e., a P-type diffusion region) may be disposed in a second upper region of the N-type well region 120. In an embodiment, each of the N-type diffusion region 121 and the P-type diffusion region 122 may have a stripe shape elongating in the first direction. In an embodiment, the N-type diffusion region 121 and the P-type diffusion region 122 may be spaced apart from each other in the second direction. Thus, the N-type diffusion region 121 and the P-type diffusion region 122 may be separated from each other by the N-type well region 120 in the second direction. The concentration of the impurity in the N-type and the P-type diffusion regions may differ. The N-type diffusion region 121 may have an impurity concentration which is higher than an impurity concentration of the N-type well region 120. Also, as an example, the P-type diffusion region 122 may have an impurity concentration which is higher than an impurity concentration of the P-type well region 110.

An interlayer insulation layer 160 may be disposed on the P-type well region 110, the N-type well region 120, the P-type diffusion region 111, the N-type diffusion region 112, the N-type diffusion region 121, and the P-type diffusion region 122. A top surface of the P-type diffusion region 111 may be in direct contact with a bottom surface of a first contact plug 131 penetrating the interlayer insulation layer 160. A top surface of the N-type diffusion region 112 may be in direct contact with a bottom surface of a second contact plug 132 penetrating the interlayer insulation layer 160. A top surface of the N-type diffusion region 121 may be in direct contact with a bottom surface of a third contact plug 133 penetrating the interlayer insulation layer 160. A top surface of the P-type diffusion region 122 may be in direct contact with a bottom surface of a fourth contact plug 134 penetrating the interlayer insulation layer 160. In an embodiment, each of the first contact plug 131, the second contact plug 132, the third contact plug 133, and the fourth contact plug 134 may be or include a metal contact plug.

A resistive pattern 150 may be disposed on the first contact plug 131 and the interlayer insulation layer 160. In an embodiment, the resistive pattern 150 may be made of or include a polysilicon material. The resistive pattern 150 may be electrically connected to the P-type diffusion region 111 through the first contact plug 131. A first electrode 141 may be disposed on the second contact plug 132 and the interlayer insulation layer 160. In an embodiment, the first electrode 141 may be made of or include a metal material. The first electrode 141 may function as a cathode. As described with reference to FIG. 1, the first electrode 141 may be connected to a supply terminal of a ground voltage VSS. The first electrode 141 may be electrically connected to the N-type diffusion region 112 through the second contact plug 132. A side surface of the first electrode 141 may be in direct contact with a side surface of the resistive pattern 150. Thus, the P-type diffusion region 111 may be electrically connected to the first electrode 141 acting as a cathode through a resistive component of the resistive pattern 150.

A second electrode 142 may be disposed on the third contact plug 133, the fourth contact plug 134, and the interlayer insulation layer 160. In an embodiment, the second electrode 142 may be made of or include a metal material. The second electrode 142 may function as an anode. As described with reference to FIG. 1, the second electrode 142 may be connected to an I/O pad of a circuit to be protected. The second electrode 142 may be electrically connected to the N-type diffusion region 121 through the third contact plug 133. In addition, the second electrode 142 may be electrically connected to the P-type diffusion region 122 through the fourth contact plug 134.

Figure 4:
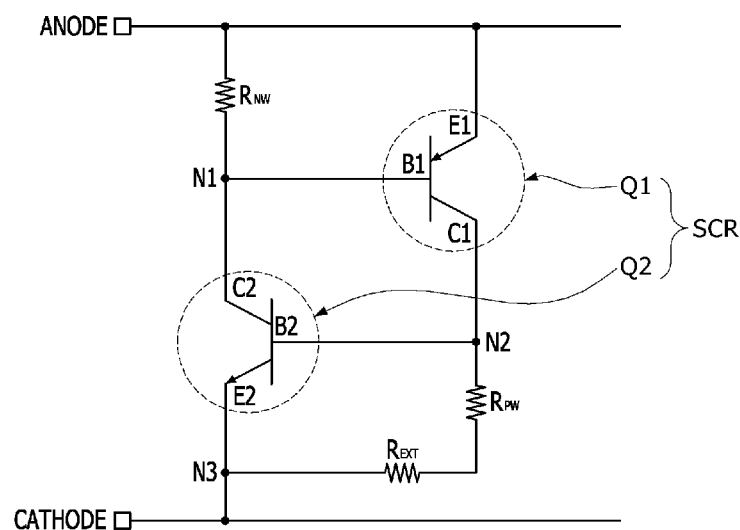
FIG. 4 is an equivalent circuit diagram of the ESD protection device illustrated in FIG. 2.

FIG. 4 is an equivalent circuit diagram of the ESD protection device 100 illustrated in FIG. 2. Referring to FIGS. 2, 3, and 4, a silicon controlled rectifier (SCR) component may parasitically exist between the anode and the cathode. The SCR may be comprised of a first bipolar junction transistor (BJT) Q1 having a PNP-type structure and a second bipolar junction transistor (BJT) Q2 having an NPN-type structure. An emitter E1 of the first bipolar junction transistor (BJT) Q1 may be coupled to the anode, and a base B1 of the first bipolar junction transistor (BJT) Q1 may be coupled to a collector C2 of the second bipolar junction transistor (BJT) Q2 through a first node N1. A collector C1 of the first bipolar junction transistor (BJT) Q1 may be coupled to a base B2 of the second bipolar junction transistor (BJT) Q2 through a second node N2. An emitter E2 of the second bipolar junction transistor (BJT) Q2 may be coupled to the cathode through a third node N3.

The emitter E1, the base B1, and the collector C1 of the first bipolar junction transistor (BJT) Q1 may correspond to the P-type diffusion region 122, the N-type diffusion region 121/the N-type well region 120, and the P-type diffusion region 111, which are illustrated in FIGS. 2 and 3, respectively. Thus, a first parasitic resistive component $R_{NW}$ due to the N-type well region 120 may be coupled between the anode and the first node N1 (i.e., the base B1 of the first bipolar junction transistor (BJT) Q1). The collector C2, the base B2, and the emitter E2 of the second bipolar junction transistor (BJT) Q2 may correspond to the N-type diffusion region 121/the N-type well region 120, the P-type diffusion region 111/the P-type well region 110, and the N-type diffusion region 112, which are illustrated in FIGS. 2 and 3, respectively. Thus, a second parasitic resistive component $R_{PW}$ due to the P-type well region 110 may be coupled between the second node N2 (i.e., the base B2 of the second bipolar junction transistor (BJT) Q2) and the third node N3 (i.e., the cathode).

An external resistive component $R_{EXT}$ may be coupled between the third node N3 and the second parasitic resistive component $R_{PW}$. That is, the external resistive component $R_{EXT}$ may be coupled between the cathode and the base B2 of the second bipolar junction transistor (BJT) Q2. Thus, the second parasitic resistive component $R_{PW}$ and the external resistive component $R_{EXT}$ may be coupled in series between the second node N2 (i.e., the collector C1 of the first bipolar junction transistor (BJT) Q1 and the base B2 of the second bipolar junction transistor (BJT) Q2) and the third node N3 (i.e., the emitter E2 of the second bipolar junction transistor (BJT) Q2 and the cathode). The external resistive component $R_{EXT}$ may be a resistive component of the resistive pattern 150 illustrated in FIGS. 2 and 3. The first parasitic resistive component $R_{NW}$ may be a parasitic resistive component provided by the N-type well region 120, and the second parasitic resistive component $R_{PW}$ may be a parasitic resistive component provided by the P-type well region 110. In contrast, the external resistive component $R_{EXT}$ is not a parasitic resistive component but an intentional resistive component provided by the resistive pattern 150.

If an ESD event occurs at the anode (i.e., an ESD current is forced into the anode), the emitter E1 and the base B1 of the first bipolar junction transistor (BJT) Q1 may be forward-biased so that the first bipolar junction transistor (BJT) Q1 is turned on. A current flowing through the first bipolar junction transistor (BJT) Q1, which is turned on, may flow through the P-type well region (110 of FIGS. 2 and 3) to turn on the second bipolar junction transistor (BJT) Q2. In such a case, a trigger voltage of the SCR coupled between the anode and the cathode may be lowered because of the presence of the external resistive component $R_{EXT}$ to prevent an inner circuit connected to the anode from being damaged. In addition, a holding voltage of the SCR may increase due to the presence of the external resistive component $R_{EXT}$.

Figure 5:
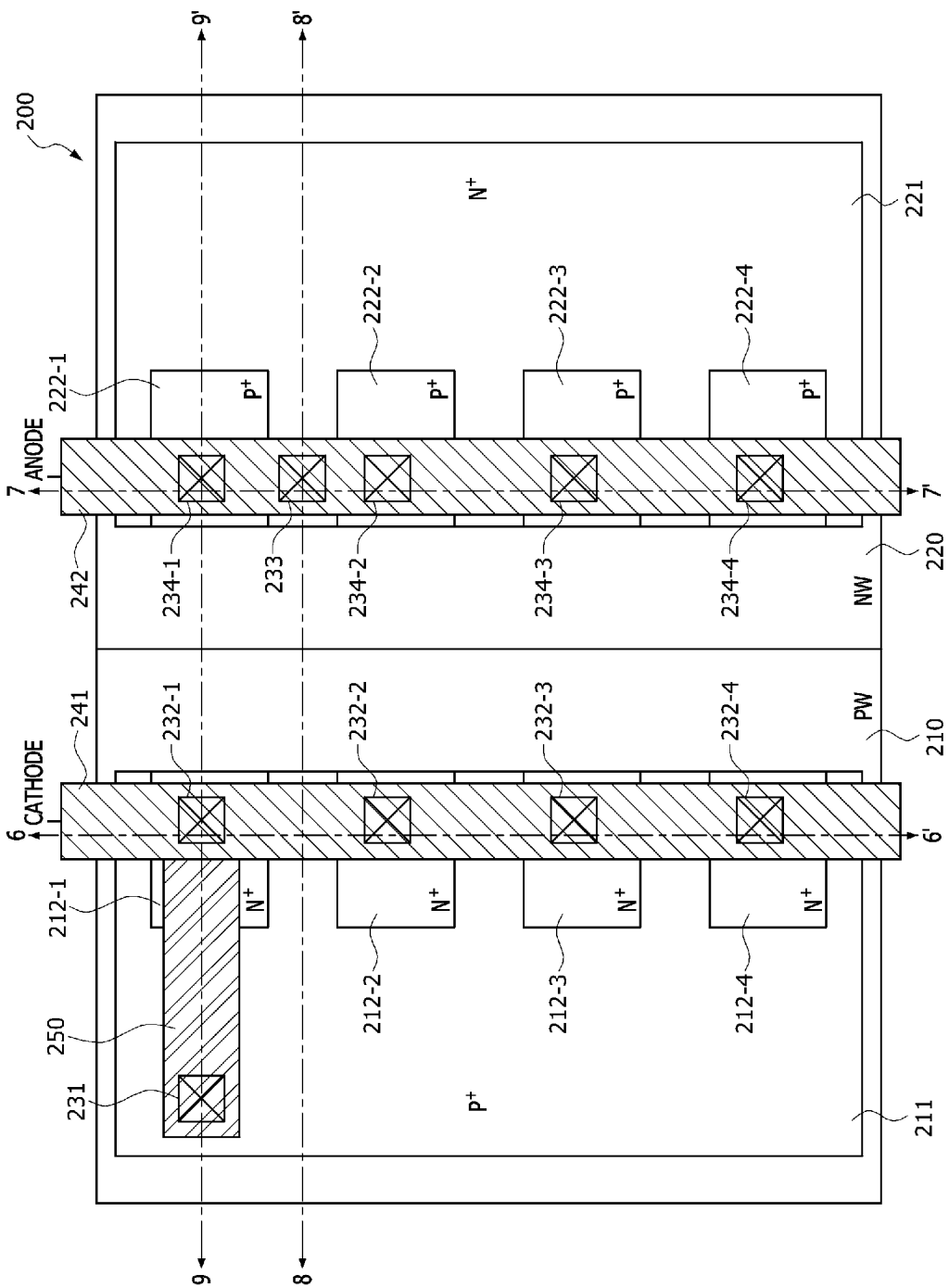
FIG. 5 is a layout diagram of an ESD protection device according to another embodiment of the present disclosure.
Figure 6:
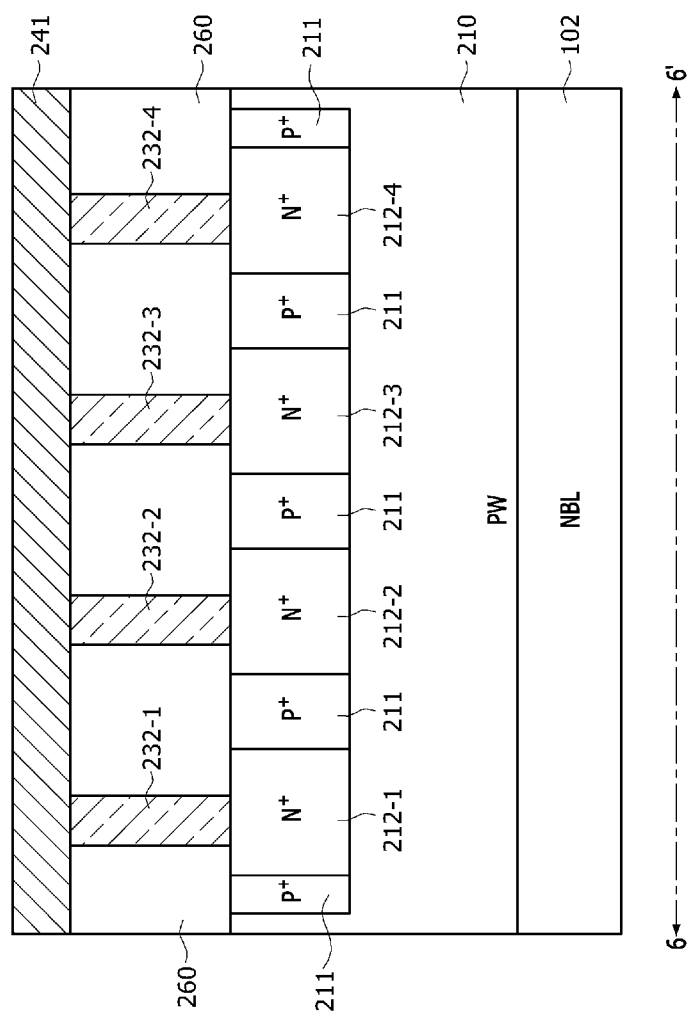
FIG. 6 is a cross-sectional view taken along a line 6-6' of FIG. 5.
Figure 7:
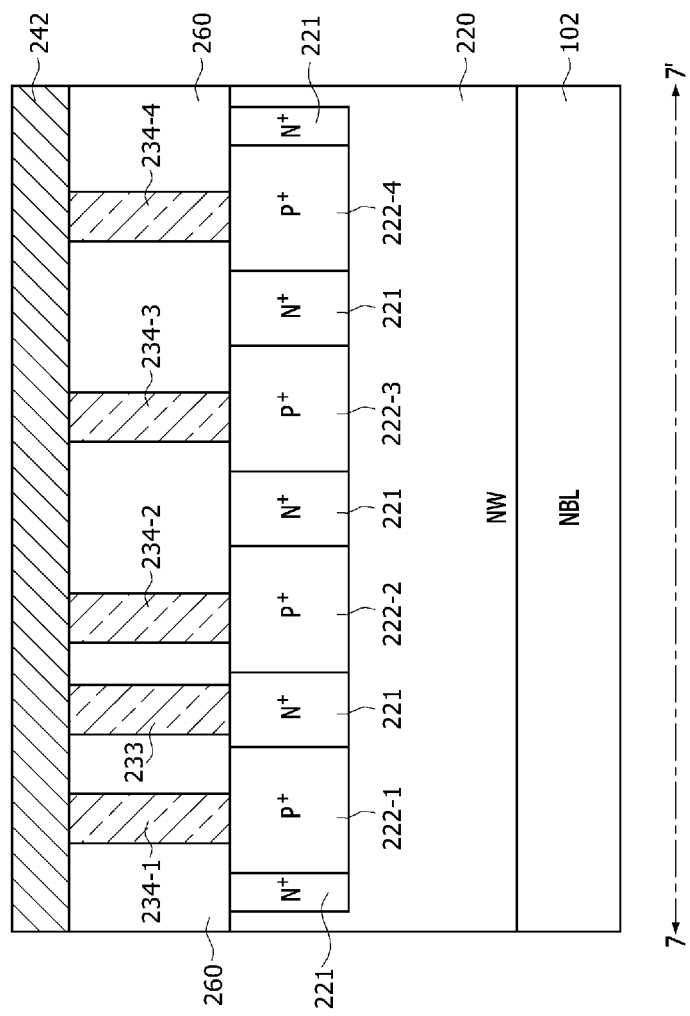
FIG. 7 is a cross-sectional view taken along a line 7-7' of FIG. 5.
Figure 8:
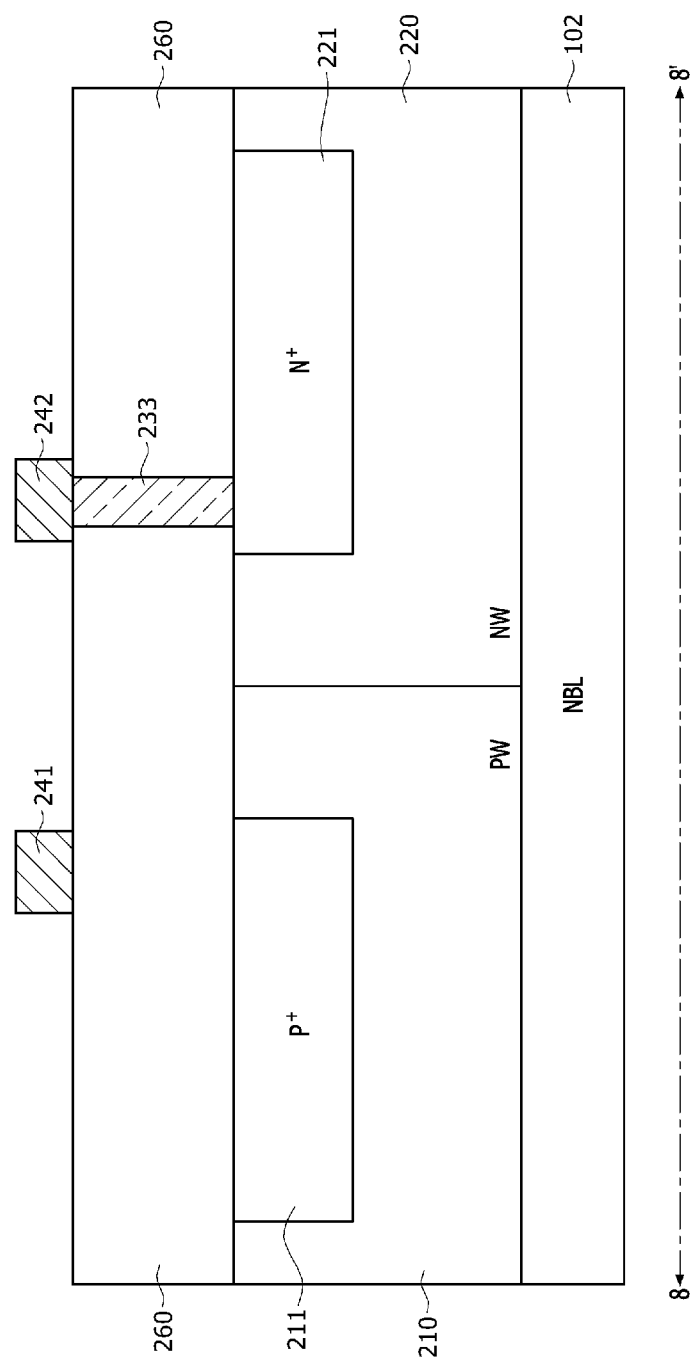
FIG. 8 is a cross-sectional view taken along a line 8-8' of FIG. 5.
Figure 9:
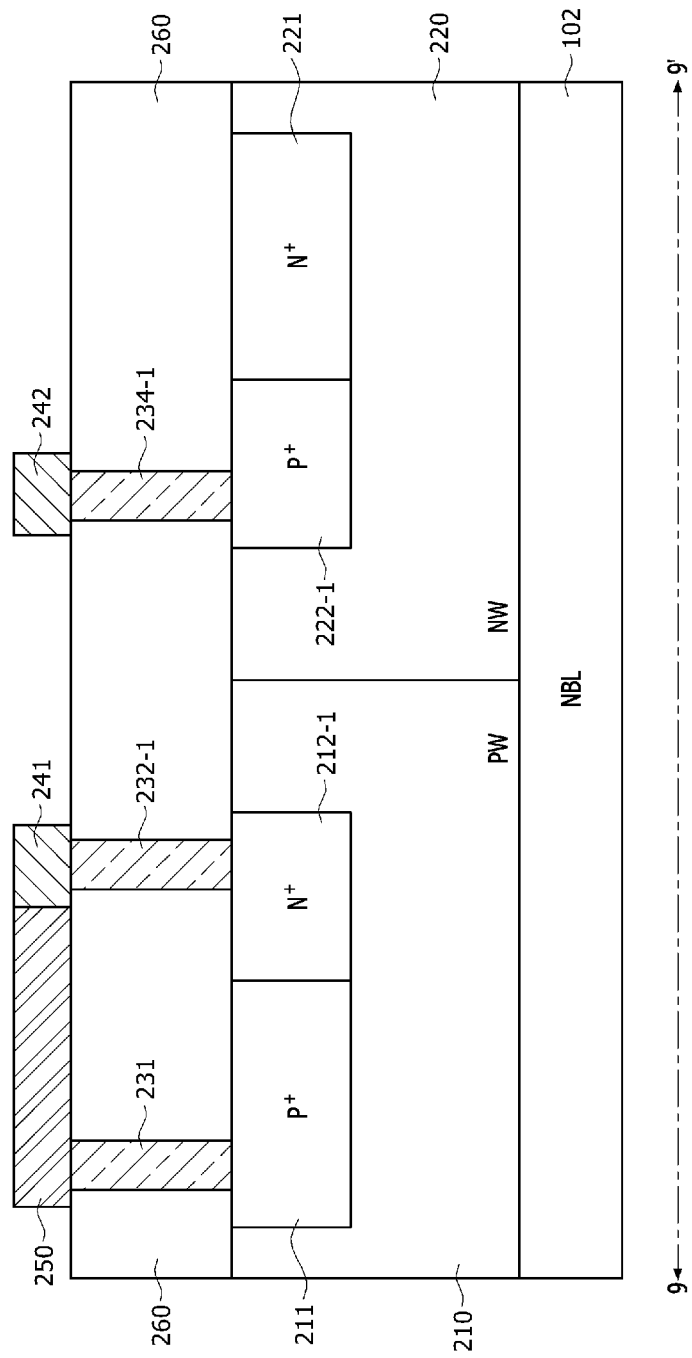
FIG. 9 is a cross-sectional view taken along a line 9-9' of FIG. 5.

FIG. 5 is a layout diagram of an ESD protection device 200 according to another embodiment. FIGS. 6 to 9 are cross-sectional views taken along lines 6-6', 7-7', 8-8', and 9-9' of FIG. 5, respectively. Referring to FIGS. 5 to 9, the ESD protection device 200 may include a first well region 210 having a first conductivity type and a second well region 220 having a second conductivity type. In an embodiment, the first conductivity type may be a P-type, and the second conductivity type may be an N-type. In an embodiment, the first well region 210 (e.g., a P-type well region) and the second well region 220 (e.g., an N-type well region) may be disposed on the N-type buried layer (NBL) 102. Although the present embodiment is described in conjunction with a case that the P-type well region 210 and the N-type well region 220 are disposed on the N-type buried layer (NBL) 102, the present embodiment is merely an example of the present disclosure. For example, in some other embodiments, the P-type well region 210 and the N-type well region 220 may be disposed on a semiconductor layer other than the N-type buried layer 102. A side surface of the P-type well region 210 may physically contact a side surface of the N-type well region 220. Thus, the P-type well region 210 and the N-type well region 220 may provide a lateral diode having a P-N junction.

A first diffusion region 211 (i.e., a P-type diffusion region) may be disposed in a first upper region of the P-type well region 210. A plurality of second diffusion regions 212-1, 212-2, 212-3, and 212-4 (i.e., a plurality of N-type diffusion regions) may be disposed in a plurality of second upper regions of the P-type well region 210, respectively. In an embodiment, the N-type diffusion regions 212-1, 212-2, 212-3, and 212-4 may be arrayed in a first direction (i.e., a vertical direction in FIG. 5), and the N-type diffusion regions 212-1, 212-2, 212-3, and 212-4 may be separated from each other by the P-type diffusion region 211. The P-type diffusion region 211 may have an impurity concentration which is higher than an impurity concentration of the P-type well region 210. The N-type diffusion regions 212-1, 212-2, 212-3, and 212-4 may have an impurity concentration which is higher than an impurity concentration of the N-type well region 220.

A third diffusion region 221 (i.e., an N-type diffusion region) may be disposed in a first upper region of the N-type well region 220. A plurality of fourth diffusion regions 222-1, 222-2, 222-3, and 222-4 (i.e., a plurality of P-type diffusion regions) may be disposed in a plurality of second upper regions of the N-type well region 220, respectively. In an embodiment, the P-type diffusion regions 222-1, 222-2, 222-3, and 222-4 may be arrayed in the first direction, and the P-type diffusion regions 222-1, 222-2, 222-3, and 222-4 may be separated from each other by the N-type diffusion region 221. The N-type diffusion region 221 may have an impurity concentration which is higher than an impurity concentration of the N-type well region 220. The P-type diffusion regions 222-1, 222-2, 222-3, and 222-4 may have an impurity concentration which is higher than an impurity concentration of the P-type well region 210.

An interlayer insulation layer 260 may be disposed on the P-type well region 210, the N-type well region 220, the P-type diffusion region 211, the N-type diffusion regions 212-1, . . . , and 212-4, the N-type diffusion region 221, and the P-type diffusion regions 222-1, . . . , and 222-4. A top surface of the P-type diffusion region 211 may be in direct contact with a bottom surface of a first contact plug 231 penetrating the interlayer insulation layer 260. Top surfaces of the N-type diffusion regions 212-1, . . . , and 212-4 may be in direct contact with bottom surfaces of second contact plugs 232-1, . . . , and 232-4 penetrating the interlayer insulation layer 260, respectively. A top surface of the N-type diffusion region 221 may be in direct contact with a bottom surface of a third contact plug 233 penetrating the interlayer insulation layer 260. Top surfaces of the P-type diffusion regions 222-1, . . . , and 222-4 may be in direct contact with bottom surfaces of fourth contact plugs 234-1, . . . , and 234-4 penetrating the interlayer insulation layer 260, respectively. In an embodiment, each of the first contact plug 231, the second contact plugs 232-1, . . . , and 232-4, the third contact plug 233, and the fourth contact plugs 234-1, . . . , and 234-4 may be or include a metal contact plug.

A resistive pattern 250 may be disposed on the first contact plug 231 and the interlayer insulation layer 260. In an embodiment, the resistive pattern 250 may be made of or include a polysilicon material. The resistive pattern 250 may be electrically connected to the P-type diffusion region 211 through the first contact plug 231. A first electrode 241 may be disposed on the second contact plugs 232-1, . . . , and 232-4 and the interlayer insulation layer 260. In an embodiment, the first electrode 241 may be made of or include a metal material. The first electrode 241 may function as a cathode. As described with reference to FIG. 1, the first electrode 241 may be connected to a supply terminal of a ground voltage VSS. The first electrode 241 may be electrically connected to the N-type diffusion regions 212-1, . . . , and 212-4 through the second contact plugs 232-1, . . . , and 232-4. A side surface of the first electrode 241 may be in direct contact with a side surface of the resistive pattern 250. Thus, the P-type diffusion region 211 may be electrically connected to the first electrode 241 acting as a cathode through an external resistive component provided by the resistive pattern 250.

A second electrode 242 may be disposed on the third contact plug 233, the fourth contact plugs 234-1, . . . , and 234-4, and the interlayer insulation layer 260. In an embodiment, the second electrode 242 may be made of or include a metal material. The second electrode 242 may function as an anode. As described with reference to FIG. 1, the second electrode 242 may be connected to an I/O pad of a circuit to be protected. The second electrode 242 may be electrically connected to the N-type diffusion region 221 through the third contact plug 233. In addition, the second electrode 242 may be electrically connected to the P-type diffusion regions 222-1, . . . , and 222-4 through the fourth contact plugs 234-1, . . . , and 234-4.

An equivalent circuit diagram of the ESD protection device 200 may be the same as the equivalent circuit diagram illustrated in FIG. 4. According to the present embodiment, an emitter region of the second bipolar junction transistor (BJT) Q2 is divided into the plurality of N-type diffusion regions 212-1, . . . , and 212-4, and an emitter region of the first bipolar junction transistor (BJT) Q1 is divided into the plurality of P-type diffusion regions 222-1, . . . , and 222-4. Thus, an emitter injection efficiency of the first and second bipolar junction transistors Q1 and Q2 may be lowered to increase a holding voltage of the ESD protection device 200.

Figure 10:
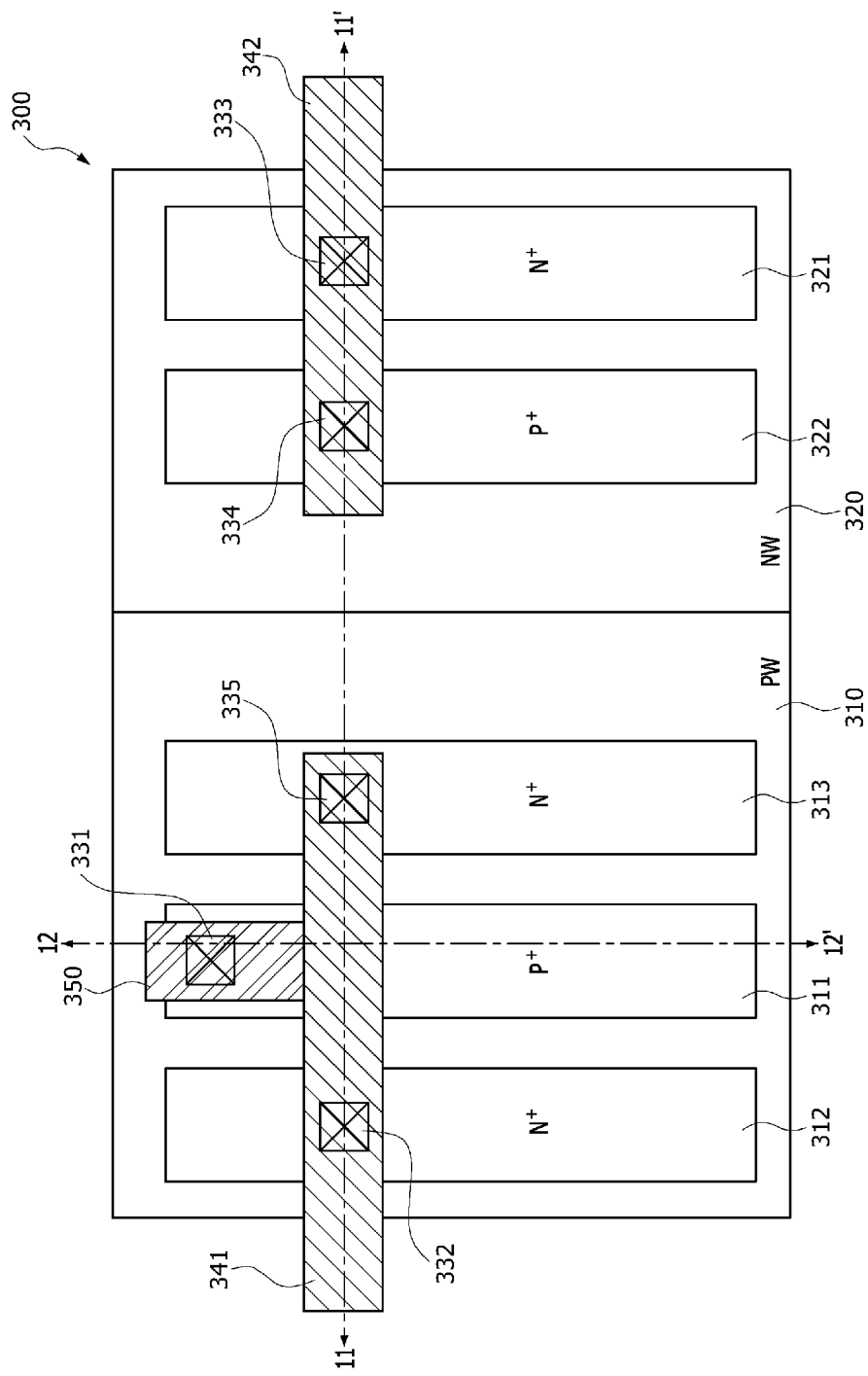
FIG. 10 is a layout diagram of an ESD protection device according to yet another embodiment of the present disclosure.
Figure 11:
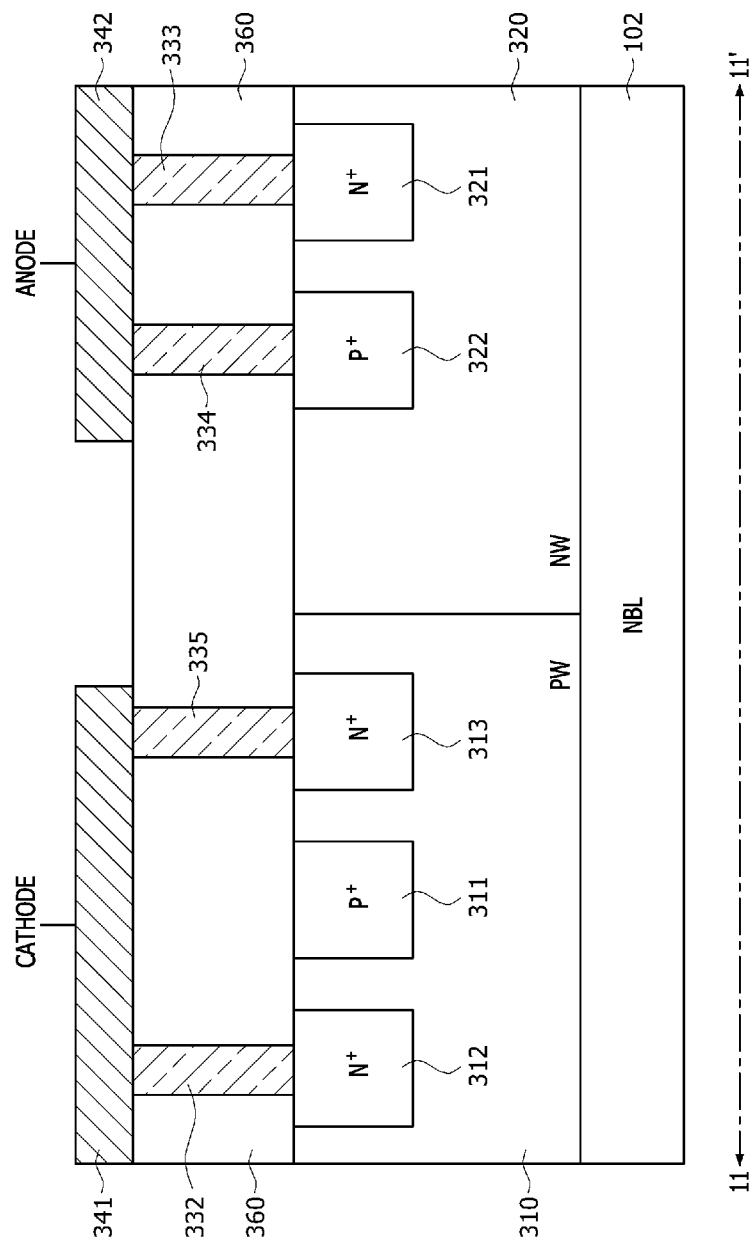
FIG. 11 is a cross-sectional view taken along a line 11-11' of FIG. 10.
Figure 12:
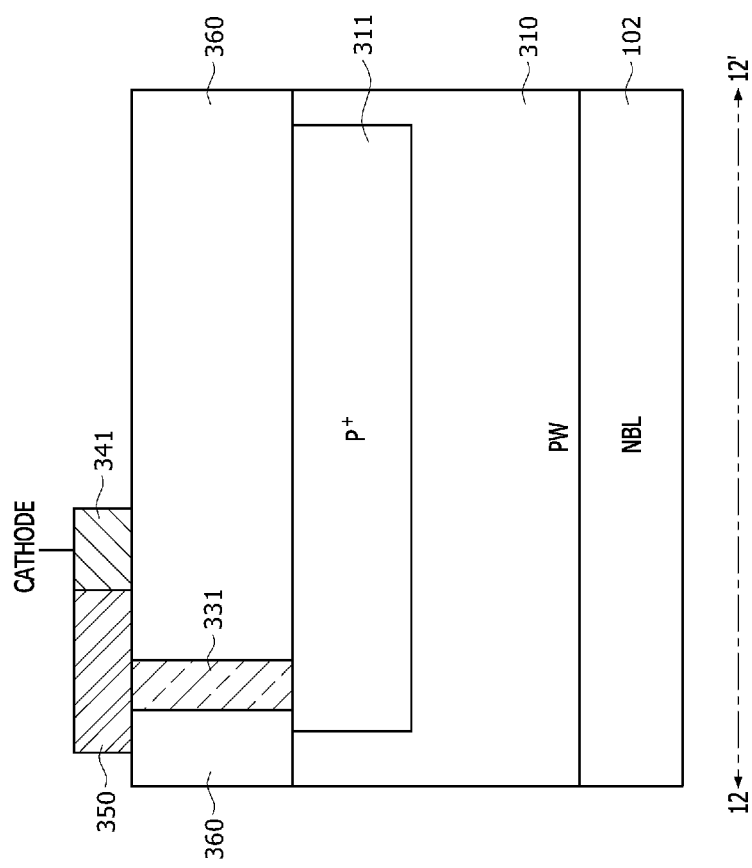
FIG. 12 is a cross-sectional view taken along a line 12-12' of FIG. 10.

FIG. 10 is a layout diagram illustrating an ESD protection device 300 according to yet another embodiment of the present disclosure. FIGS. 11 and 12 are cross-sectional views taken along lines 11-11' and 12-12' of FIG. 10, respectively. Referring to FIGS. 10, 11, and 12, the ESD protection device 300 may include a first well region 310 having a first conductivity type and a second well region 320 having a second conductivity type. In an embodiment, the first conductivity type may be a P-type, and the second conductivity type may be an N-type. In an embodiment, the first well region 310 (e.g., a P-type well region) and the second well region 320 (e.g., an N-type well region) may be disposed on an N-type buried layer (NBL) 102. Although the present embodiment of FIG. 10 is described in conjunction with a case that the P-type well region 310 and the N-type well region 320 are disposed on the N-type buried layer (NBL) 102, the present embodiment is merely an example of the present disclosure. For example, in some other embodiments, the P-type well region 310 and the N-type well region 320 may be disposed on a semiconductor layer other than the N-type buried layer 102. A side surface of the P-type well region 310 may physically contact a side surface of the N-type well region 320. Thus, the P-type well region 310 and the N-type well region 320 may provide a lateral diode having a P-N junction.

A first diffusion region 311 (i.e., a P-type diffusion region) may be disposed in a first upper region of the P-type well region 310. A second diffusion region 312 (i.e., an N-type diffusion region) may be disposed in a second upper region of the P-type well region 310. A fifth diffusion region 313 (i.e., an N-type diffusion region) may be disposed in a third upper region of the P-type well region 310. In an embodiment, the P-type diffusion region 311 may be disposed between the N-type diffusion region 312 and the N-type diffusion region 313. In an embodiment, each of the P-type diffusion region 311, the N-type diffusion region 312, and the N-type diffusion region 313 may have a stripe shape elongating in a first direction (i.e., a vertical direction in FIG. 10). In an embodiment, the P-type diffusion region 311, the N-type diffusion region 312, and the N-type diffusion region 313 may be spaced apart from each other in a second direction (i.e., a horizontal direction in FIG. 10) intersecting the first direction. Thus, the P-type diffusion region 311, the N-type diffusion region 312, and the N-type diffusion region 313 may be separated from each other by the P-type well region 310 in the second direction. The P-type diffusion region 311 may have an impurity concentration which is higher than an impurity concentration of the P-type well region 310. The N-type diffusion regions 312 and 313 may have an impurity concentration which is higher than an impurity concentration of the N-type well region 320.

A third diffusion region 321 (i.e., an N-type diffusion region) may be disposed in a first upper region of the N-type well region 320. A fourth diffusion region 322 (i.e., a P-type diffusion region) may be disposed in a second upper region of the N-type well region 320. In an embodiment, each of the N-type diffusion region 321 and the P-type diffusion region 322 may have a stripe shape elongating in the first direction. In an embodiment, the N-type diffusion region 321 and the P-type diffusion region 322 may be spaced apart from each other in the second direction. Thus, the N-type diffusion region 321 and the P-type diffusion region 322 may be separated from each other by the N-type well region 320 in the second direction. The N-type diffusion region 321 may have an impurity concentration which is higher than an impurity concentration of the N-type well region 320. The P-type diffusion region 322 may have an impurity concentration which is higher than an impurity concentration of the P-type well region 310.

An interlayer insulation layer 360 may be disposed on the P-type well region 310, the N-type well region 320, the P-type diffusion region 311, the N-type diffusion region 312, the N-type diffusion region 321, the P-type diffusion region 322, and the N-type diffusion region 313. A top surface of the P-type diffusion region 311 may be in direct contact with a bottom surface of a first contact plug 331 penetrating the interlayer insulation layer 360. A top surface of the N-type diffusion region 312 may be in direct contact with a bottom surface of a second contact plug 332 penetrating the interlayer insulation layer 360. A top surface of the N-type diffusion region 321 may be in direct contact with a bottom surface of a third contact plug 133 penetrating the interlayer insulation layer 360. A top surface of the P-type diffusion region 322 may be in direct contact with a bottom surface of a fourth contact plug 334 penetrating the interlayer insulation layer 360. A top surface of the N-type diffusion region 313 may be in direct contact with a bottom surface of a fifth contact plug 335 penetrating the interlayer insulation layer 360. In an embodiment, each of the first contact plug 331, the second contact plug 332, the third contact plug 333, the fourth contact plug 334, and the fifth contact plug 335 may be or include a metal contact plug.

A resistive pattern 350 may be disposed on the first contact plug 331 and the interlayer insulation layer 360. In an embodiment, the resistive pattern 350 may be made of or include a polysilicon material. The resistive pattern 350 may be electrically connected to the P-type diffusion region 311 through the first contact plug 331. A first electrode 341 may be disposed on the second contact plug 332, the fifth contact plug 335, and the interlayer insulation layer 360. In an embodiment, the first electrode 341 may be made of or include a metal material. The first electrode 341 may function as a cathode. As described with reference to FIG. 1, the first electrode 341 may be connected to a supply terminal of a ground voltage VSS. The first electrode 341 may be electrically connected to the N-type diffusion region 312 through the second contact plug 332 and may also be electrically connected to the N-type diffusion region 313 through the fifth contact plug 335. A side surface of the first electrode 341 may be in direct contact with a side surface of the resistive pattern 350. Thus, the P-type diffusion region 311 may be electrically connected to the first electrode 341 acting as a cathode through the resistive pattern 350.

A second electrode 342 may be disposed on the third contact plug 333, the fourth contact plug 334, and the interlayer insulation layer 360. In an embodiment, the second electrode 342 may be made of or include a metal material. The second electrode 342 may function as an anode. As described with reference to FIG. 1, the second electrode 342 may be connected to an I/O pad of a circuit to be protected. The second electrode 342 may be electrically connected to the N-type diffusion region 321 through the third contact plug 333. In addition, the second electrode 342 may be electrically connected to the P-type diffusion region 322 through the fourth contact plug 334.

Figure 13:
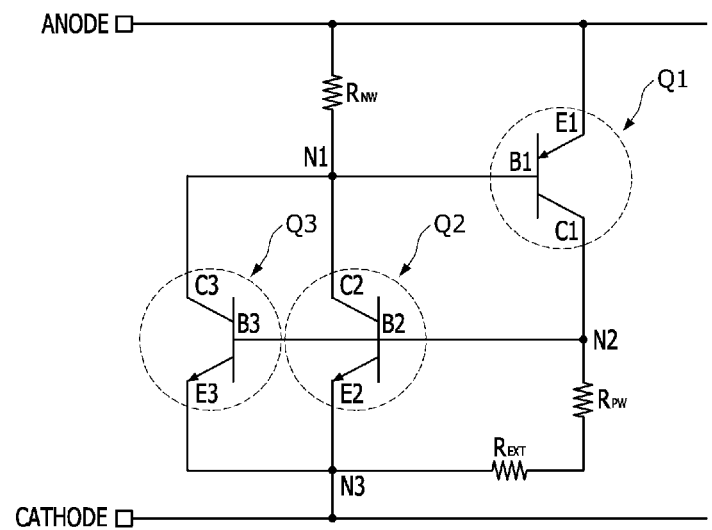
FIG. 13 is an equivalent circuit diagram of the ESD protection device illustrated in FIG. 10.

FIG. 13 is an equivalent circuit diagram of the ESD protection device 300 illustrated in FIG. 10. Referring to FIGS. 10 to 13, a silicon controlled rectifier (SCR) component comprised of a first bipolar junction transistor (BJT) Q1 having a PNP-type structure and a second bipolar junction transistor (BJT) Q2 having an NPN-type structure may parasitically exist between the anode and the cathode. An emitter E1 of the first bipolar junction transistor (BJT) Q1 may be coupled to the anode, and a base B1 of the first bipolar junction transistor (BJT) Q1 may be coupled to a collector C2 of the second bipolar junction transistor (BJT) Q2 through a first node N1. A collector C1 of the first bipolar junction transistor (BJT) Q1 may be coupled to a base B2 of the second bipolar junction transistor (BJT) Q2 through a second node N2. An emitter E2 of the second bipolar junction transistor (BJT) Q2 may be coupled to the cathode through a third node N3.

The ESD protection device 300 may further include a third bipolar junction transistor (BJT) Q3 which is coupled between the first node N1 and the third node N3. Thus, the third bipolar junction transistor (BJT) Q3 and the second bipolar junction transistor (BJT) Q2 may be coupled in parallel between the first node N1 and the third node N3. Specifically, a collector C3 of the third bipolar junction transistor (BJT) Q3 may be coupled to the base B1 of the first bipolar junction transistor (BJT) Q1 and the collector C2 of the second bipolar junction transistor (BJT) Q2 through the first node N1. A base B3 of the third bipolar junction transistor (BJT) Q3 may be coupled to the collector C1 of the first bipolar junction transistor (BJT) Q1 and the base B2 of the second bipolar junction transistor (BJT) Q2 through the second node N2. An emitter E3 of the third bipolar junction transistor (BJT) Q3 may be coupled to the emitter E2 of the second bipolar junction transistor (BJT) Q2 through the third node N3.

The emitter E1, the base B1, and the collector C1 of the first bipolar junction transistor (BJT) Q1 may correspond to the P-type diffusion region 322, the N-type diffusion region 321/the N-type well region 320, and the P-type diffusion region 311, which are illustrated in FIGS. 10 and 11, respectively. Thus, a first parasitic resistive component $R_{NW}$ due to the N-type well region 320 may be coupled between the anode and the first node N1 connecting the base B1 of the first bipolar junction transistor (BJT) Q1, the collector C2 of the second bipolar junction transistor (BJT) Q2, and the collector C3 of the third bipolar junction transistor (BJT) Q3 to each other. The collector C2, the base B2, and the emitter E2 of the second bipolar junction transistor (BJT) Q2 may correspond to the N-type diffusion region 321/the N-type well region 320, the P-type diffusion region 311/the P-type well region 310, and the N-type diffusion region 312, which are illustrated in FIGS. 10 and 11, respectively. In addition, the collector C3, the base B3, and the emitter E3 of the third bipolar junction transistor (BJT) Q3 may correspond to the N-type diffusion region 321/the N-type well region 320, the P-type diffusion region 311/the P-type well region 310, and the N-type diffusion region 313, which are illustrated in FIGS. 10 and 11, respectively. Thus, a second parasitic resistive component $R_{PW}$ due to the P-type well region 310 may be coupled between the third node N3 (i.e., the cathode) and the second node N2 connecting the collector C1 of the first bipolar junction transistor (BJT) Q1, the base B2 of the second bipolar junction transistor (BJT) Q2, and the third base B3 of the third bipolar junction transistor (BJT) Q3 to each other.

An external resistive component $R_{EXT}$ may be coupled between the third node N3 and the second parasitic resistive component $R_{PW}$. Thus, the second parasitic resistive component $R_{PW}$ and the external resistive component $R_{EXT}$ may be coupled in series between the second node N2 and the third node N3. The external resistive component $R_{EXT}$ may be a resistive component of the resistive pattern 350 illustrated in FIGS. 10 and 11. The first parasitic resistive component $R_{NW}$ may be a parasitic resistive component provided by the N-type well region 320, and the second parasitic resistive component $R_{PW}$ may be a parasitic resistive component provided by the P-type well region 310. In contrast, the external resistive component $R_{EXT}$ is not a parasitic resistive component but a resistive component provided by the resistive pattern 350.

According to the present embodiment, the second bipolar junction transistor (BJT) Q2 and the third bipolar junction transistor (BJT) Q3 may be coupled in parallel between the first node N1 and the third node N3. Thus, if the second bipolar junction transistor (BJT) Q2 is turned on, the third bipolar junction transistor (BJT) Q3 may also be turned on. If an ESD event occurs at the anode (i.e., an ESD current is forced into the anode), an ESD current path provided by the third bipolar junction transistor (BJT) Q3, which is turned on, may be added between the anode and the cathode to increase an amount of the ESD current.

Figure 14:
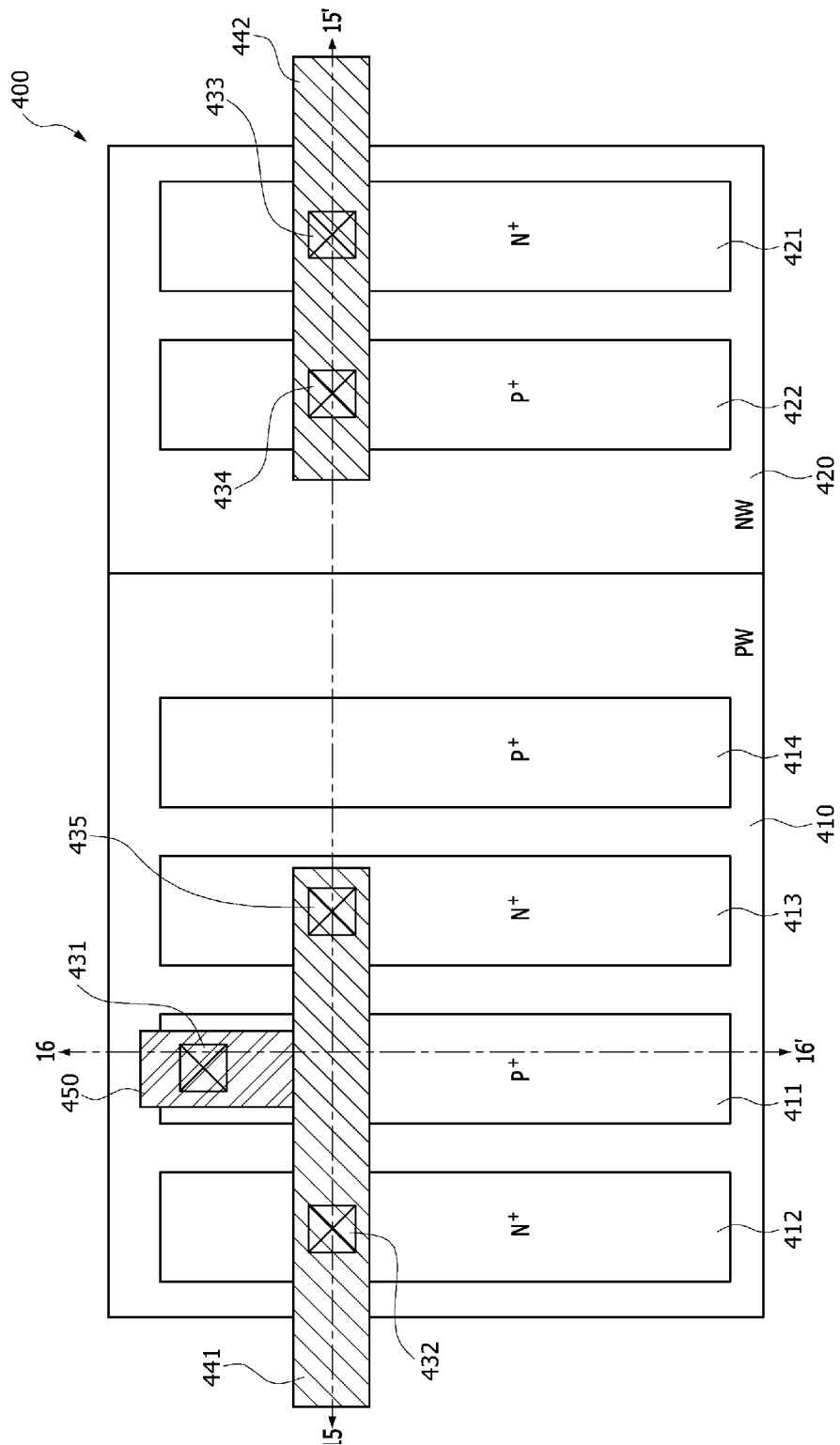
FIG. 14 is a layout diagram of an ESD protection device according to still another embodiment of the present disclosure.
Figure 15:
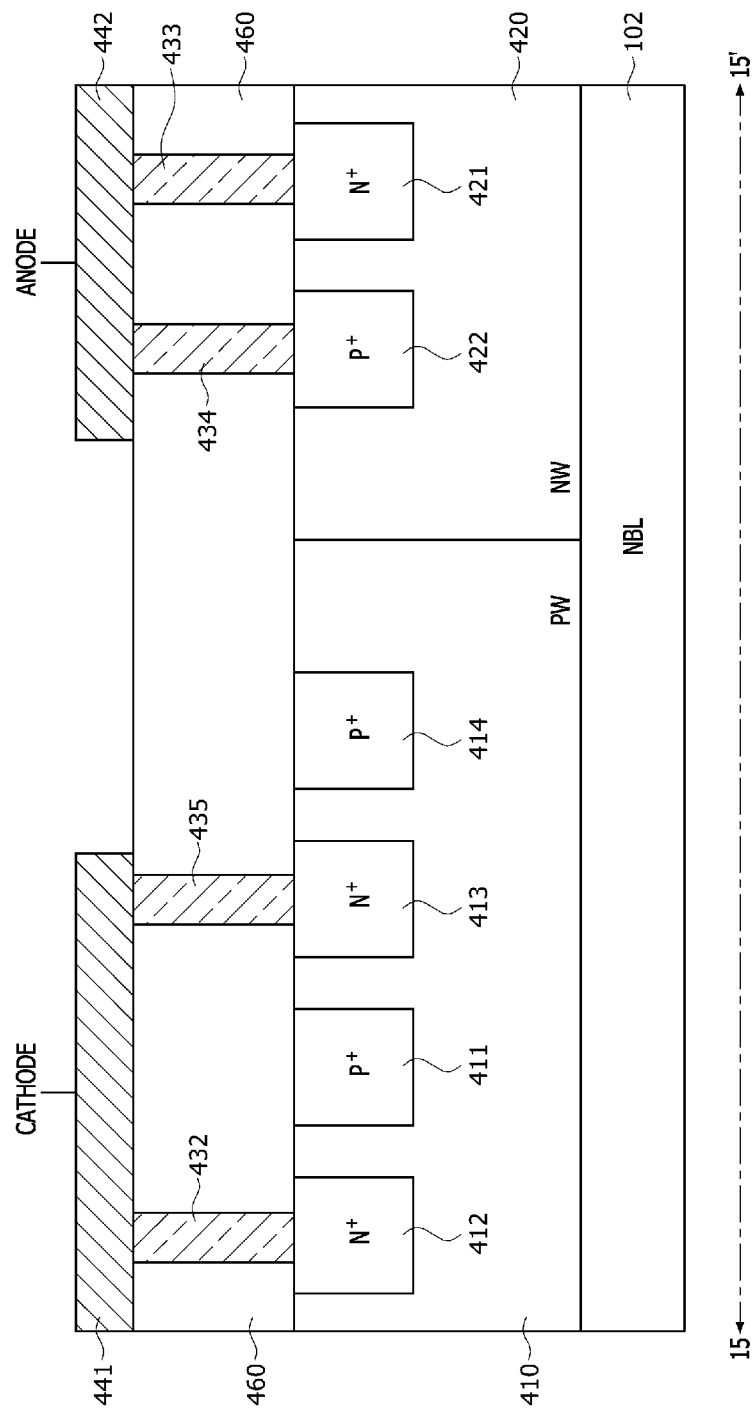
FIG. 15 is a cross-sectional view taken along a line 15-15' of FIG. 14.
Figure 16:
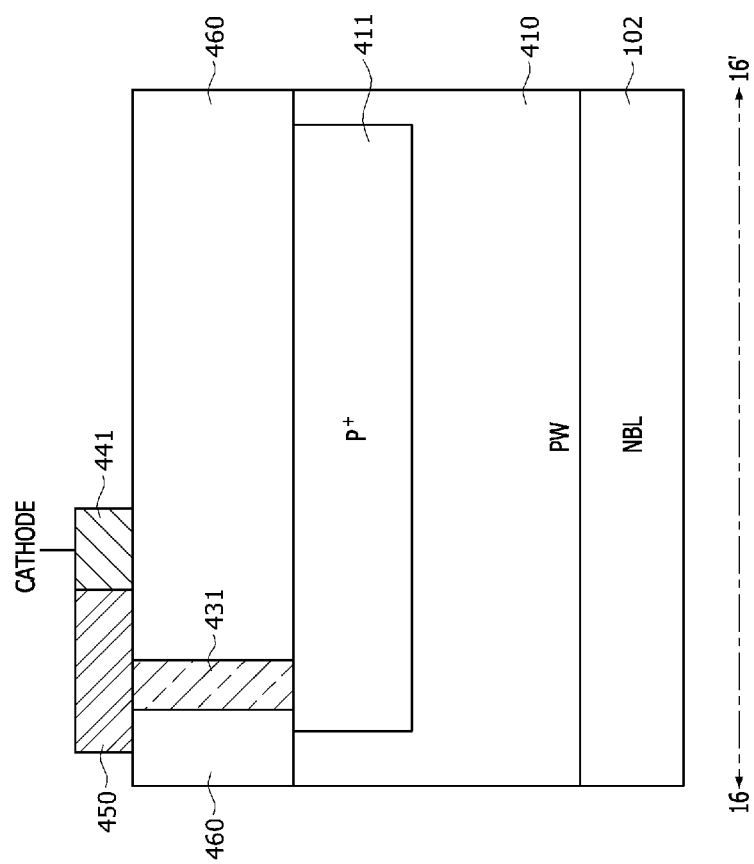
FIG. 16 is a cross-sectional view taken along a line 16-16' of FIG. 14.

FIG. 14 is a layout diagram of an ESD protection device 400 according to still another embodiment of the present disclosure. FIGS. 15 and 16 are cross-sectional views taken along lines 15-15' and 16-16' of FIG. 14, respectively. Referring to FIGS. 14, 15, and 16, the ESD protection device 400 may include a first well region 410 having a first conductivity type and a second well region 420 having a second conductivity type. In an embodiment, the first conductivity type may be a P-type, and the second conductivity type may be an N-type. In an embodiment, the first well region 410 (e.g., a P-type well region) and the second well region 420 (e.g., an N-type well region) may be disposed on an N-type buried layer (NBL) 102. Although the present embodiment of FIG. 14 is described in conjunction with a case that the P-type well region 410 and the N-type well region 420 are disposed on the N-type buried layer (NBL) 102, the present embodiment is merely an example of the present disclosure. For example, in some other embodiments, the P-type well region 410 and the N-type well region 420 may be disposed on a semiconductor layer other than the N-type buried layer 102. A side surface of the P-type well region 410 may physically contact a side surface of the N-type well region 420. Thus, the P-type well region 410 and the N-type well region 420 may provide a lateral diode having a P-N junction.

A first diffusion region 411 (i.e., a P-type diffusion region) may be disposed in a first upper region of the P-type well region 410. A second diffusion region 412 (i.e., an N-type diffusion region) may be disposed in a second upper region of the P-type well region 410. A fifth diffusion region 413 (i.e., an N-type diffusion region) may be disposed in a third upper region of the P-type well region 410. A sixth diffusion region 414 (i.e., a P-type diffusion region) may be disposed in a fourth upper region of the P-type well region 410. In an embodiment, the P-type diffusion region 411 may be disposed between the N-type diffusion region 412 and the N-type diffusion region 413, and the N-type diffusion region 413 may be disposed between the P-type diffusion region 411 and the P-type diffusion region 414. In an embodiment, each of the P-type diffusion region 411, the N-type diffusion region 412, the N-type diffusion region 413, and the P-type diffusion region 414 may have a stripe shape elongating in a first direction (i.e., a vertical direction in FIG. 14). In an embodiment, the P-type diffusion region 411, the N-type diffusion region 412, the N-type diffusion region 413, and the P-type diffusion region 414 may be spaced apart from each other in a second direction (i.e., a horizontal direction in FIG. 14) intersecting the first direction. Thus, the P-type diffusion region 411, the N-type diffusion region 412, the N-type diffusion region 413, and the P-type diffusion region 414 may be separated from each other by the P-type well region 410 in the second direction. The P-type diffusion region 411 and the P-type diffusion region 414 may have an impurity concentration which is higher than an impurity concentration of the P-type well region 410. The N-type diffusion regions 412 and 413 may have an impurity concentration which is higher than an impurity concentration of the N-type well region 420.

A third diffusion region 421 (i.e., an N-type diffusion region) may be disposed in a first upper region of the N-type well region 420. A fourth diffusion region 422 (i.e., a P-type diffusion region) may be disposed in a second upper region of the N-type well region 420. In an embodiment, each of the N-type diffusion region 421 and the P-type diffusion region 422 may have a stripe shape elongating in the first direction. In an embodiment, the N-type diffusion region 421 and the P-type diffusion region 422 may be spaced apart from each other in the second direction. Thus, the N-type diffusion region 421 and the P-type diffusion region 422 may be separated from each other by the N-type well region 420 in the second direction. The N-type diffusion region 421 may have an impurity concentration which is higher than an impurity concentration of the N-type well region 420. The P-type diffusion region 422 may have an impurity concentration which is higher than an impurity concentration of the P-type well region 410.

An interlayer insulation layer 460 may be disposed on the P-type well region 410, the N-type well region 420, the P-type diffusion region 411, the N-type diffusion region 412, the N-type diffusion region 421, the P-type diffusion region 422, the N-type diffusion region 413, and the P-type diffusion region 414. A top surface of the P-type diffusion region 411 may be in direct contact with a bottom surface of a first contact plug 431 penetrating the interlayer insulation layer 460. A top surface of the N-type diffusion region 412 may be in direct contact with a bottom surface of a second contact plug 432 penetrating the interlayer insulation layer 460. A top surface of the N-type diffusion region 421 may be in direct contact with a bottom surface of a third contact plug 433 penetrating the interlayer insulation layer 460. A top surface of the P-type diffusion region 422 may be in direct contact with a bottom surface of a fourth contact plug 434 penetrating the interlayer insulation layer 460. A top surface of the N-type diffusion region 413 may be in direct contact with a bottom surface of a fifth contact plug 435 penetrating the interlayer insulation layer 460. In an embodiment, each of the first contact plug 431, the second contact plug 432, the third contact plug 433, the fourth contact plug 434, and the fifth contact plug 435 may be or include a metal contact plug. The P-type diffusion region 414 may be electrically floated. That is, the P-type diffusion region 414 may be electrically isolated.

A resistive pattern 450 may be disposed on the first contact plug 431 and the interlayer insulation layer 460. In an embodiment, the resistive pattern 450 may be made of or include a polysilicon material. The resistive pattern 450 may be electrically connected to the P-type diffusion region 411 through the first contact plug 431. A first electrode 441 may be disposed on the second contact plug 432, the fifth contact plug 435, and the interlayer insulation layer 460. In an embodiment, the first electrode 441 may be made of or include a metal material. The first electrode 441 may function as a cathode. As described with reference to FIG. 1, the first electrode 441 may be connected to a supply terminal of a ground voltage VSS. The first electrode 441 may be electrically connected to the N-type diffusion region 412 through the second contact plug 432 and may also be electrically connected to the N-type diffusion region 413 through the fifth contact plug 435. A side surface of the first electrode 441 may be in direct contact with a side surface of the resistive pattern 450. Thus, the P-type diffusion region 411 may be electrically connected to the first electrode 441 acting as a cathode through the resistive pattern 450.

A second electrode 442 may be disposed on the third contact plug 433, the fourth contact plug 434, and the interlayer insulation layer 460. In an embodiment, the second electrode 442 may be made of or include a metal material. The second electrode 442 may function as an anode. As described with reference to FIG. 1, the second electrode 442 may be connected to an I/O pad of a circuit to be protected. The second electrode 442 may be electrically connected to the N-type diffusion region 421 through the third contact plug 433. In addition, the second electrode 442 may be electrically connected to the P-type diffusion region 422 through the fourth contact plug 434.

An equivalent circuit diagram of the ESD protection device 400 may be the same as the equivalent circuit diagram illustrated in FIG. 13. The ESD protection device 400 according to the present embodiment may include the P-type diffusion region 414 which is disposed in the P-type well region 410 and is electrically floated. Thus, while the ESD protection device 400 operates, base currents of the second and third bipolar junction transistors Q2 and Q3 may increase due to the presence of the floated P-type diffusion region 414. If the base currents of the second and third bipolar junction transistors Q2 and Q3 increase, a current gain of the ESD protection device 400 may be reduced for increasing a holding voltage of the ESD protection device 400.

According to the various embodiments described above, it may be possible to provide ESD protection devices having a low trigger voltage, a large amount of ESD current, and a relatively high holding voltage.

Various non-limiting embodiments of the present disclosure have been presented above for illustrative purposes. Those of ordinary skill in the art will appreciate that various modifications, additions, and substitutions are possible. While this disclosure contains many specifics, these should not be construed as limitations on the scope of the present teachings or of what may be claimed, but rather as descriptions of features that may be specific to particular embodiments. Certain features that are described in this disclosure in the context of separate embodiments can also be implemented in combination in a single embodiment. Conversely, various features that are described in the context of a single embodiment can also be implemented in multiple embodiments separately or in any suitable subcombination. Moreover, although features may be described above as acting in certain combinations and even initially claimed as such, one or more features from a claimed combination can in some cases be excised from the combination, and the claimed combination may be directed to a subcombination or variation of a subcombination.

While various embodiments have been described above, it will be understood to those skilled in the art that the embodiments are examples of the invention only and that the invention is not intended to be limited to these embodiments. Many other embodiments and variations of the invention may be envisioned by those skilled in the art to which the invention pertains without departing from the spirit and scope of the invention as defined by the appended claims.

What is claimed is:

1. An electro-static discharge (ESD) protection device comprising:
a first well region of a first conductivity type;
a second well region of a second conductivity type disposed to contact the first well region;
a first diffusion region of the first conductivity type disposed in the first well region;
a plurality of second diffusion regions of the second conductivity type disposed in the first well region to be separated from each other by the first diffusion region in a first direction, sides of the plurality of second diffusion regions being directly contacted to sides of the first diffusion region;
a third diffusion region of the second conductivity type disposed in the second well region;

a plurality of fourth diffusion regions of the first conductivity type disposed in the second well region to be separated from each other by the third diffusion region in the first direction, sides of the plurality of fourth diffusion regions being directly contacted to sides of the third diffusion region;

a resistive pattern coupled to the first diffusion region through a first contact plug;

a first electrode coupled to the plurality of second diffusion regions through respective ones of second contact plugs and electrically coupled to the resistive pattern; and a second electrode coupled to the third diffusion region through a third contact plug and coupled to the plurality of fourth diffusion regions through respective ones of fourth contact plugs, wherein the plurality of fourth diffusion regions, the third diffusion region/the second well region, and the first diffusion region/the first well region correspond to an emitter, a base, and a collector of a first bipolar junction transistor, respectively, wherein the third diffusion region/the second well region, the first region/the first well region, and the plurality of second diffusion regions correspond to a collector, a base, and an emitter of a second bipolar junction transistor, respectively, and wherein the first bipolar junction transistor and the second bipolar junction transistor are components of a silicon controlled rectifier (SCR).

2. The ESD protection device of claim 1, wherein the first conductivity type is a P-type and the second conductivity type is an N-type.

3. The ESD protection device of claim 1,
wherein the first and fourth diffusion regions have an impurity concentration which is higher than an impurity concentration of the first well region; and
wherein the second and third diffusion regions have an impurity concentration which is higher than an impurity concentration of the second well region.

4. The ESD protection device of claim 1, wherein the resistive pattern includes a polysilicon material.

5. The ESD protection device of claim 4, wherein each of the first and second electrodes includes a metal material.

6. The ESD protection device of claim 5, wherein the first electrode is coupled to a supply terminal of a ground voltage; and wherein the second electrode is coupled to a pad of a circuit to be protected.

* * * * *